United States Patent [19]

Eulenberg

[11] Patent Number: 4,646,014

[45] Date of Patent: Feb. 24, 1987

[54] HALL EFFECT FIELD SENSOR CIRCUIT WITH TEMPERATURE COMPENSATION USING OP AMPLIFIER

[75] Inventor: Hannspeter Eulenberg, Aachen, Fed. Rep. of Germany

[73] Assignee: Kernforschungsanlage Julich Gesellschaft mit beschrankter Haftung, Julich, Fed. Rep. of Germany

[21] Appl. No.: 534,587

[22] Filed: Sep. 22, 1983

[30] Foreign Application Priority Data

Sep. 23, 1982 [DE] Fed. Rep. of Germany ....... 3235188

[51] Int. Cl.[4] .................... G01R 33/06; G01N 27/72; H03K 17/90; H03K 19/18
[52] U.S. Cl. ................................ 324/251; 324/224; 324/225; 307/309; 338/32 H
[58] Field of Search ........... 324/251, 225, 224, 117 H; 338/32 H; 307/309, 311

[56] References Cited

U.S. PATENT DOCUMENTS 4,134,030  1/1979  Pace .................................. 307/309
4,435,653  3/1984  Matul et al. .................... 324/117 H Primary Examiner—Ernest F. Karlsen
Assistant Examiner—Walter E. Snow
Attorney, Agent, or Firm—Karl F. Ross; Herbert Dubno

[57] ABSTRACT

A Hall effect magnetic field sensing circuit provides an operation amplifier which is connected to a signal voltage terminal of the Hall effect sensor with a negative temperature coefficient (TK) of the resistance of the drive current path whose drive current path is provided with an input resistor such that a portion of the Hall effect sensor responds to the change in temperature thereof to vary the drive current and provide temperature compensation of the Hall voltage. A differential amplifier can be provided to eliminate the zero residual voltage effect and a summing circuit connected to the operational amplifier rectifies nonlinearity.

11 Claims, 5 Drawing Figures

HALL EFFECT FIELD SENSOR CIRCUIT WITH TEMPERATURE COMPENSATION USING OP AMPLIFIER

FIELD OF THE INVENTION

My present invention relates to a Hall effect field sensor circuit and, more particularly, to an improved temperature-compensated field detection circuit utilizing a Hall generator with a negative temperature coefficient (TK) of the resistance of the drive current path.

BACKGROUND OF THE INVENTION

Hall generators have been used in magnetic field sensing systems to generate an output voltage or so-called Hall voltage which is a function of a magnetic field applied perpendicular to the surface of the Hall generator. At right angles to this direction, a drive current is passed through the Hall generator and at right angles to the current flow, via signal contacts, the Hall voltage can be tapped from the Hall generator. The Hall field sensor shows an undesirable temperature drift of the Hall voltage.

It is known, in order to compensate for the temperature drift of the Hall voltage, to provide an input resistor in series with a constant voltage generator for the drive current path of the Hall generator. In this case, the drive current traversing the generator increases with increasing temperature of the sensor because of the negative temperature coefficient of the resistance of the drive current path. The resulting reduction with increasing temperature of the Hall voltage is thereby counteracted.

While this circuit has been found to be marginally effective in compensating for temperature drift, it is not entirely successful and the circuit does not allow for other advantages, for example a linearization of the characteristic of the sensor.

OBJECTS OF THE INVENTION

It is the principal object of this invention to provide an improved compensation circuit for the temperature drift of the Hall voltage in a magnetic field sensor operating with a Hall generator.

Still another object of the invention is to provide a circuit which can compensate for such temperature drift and also permit additional improvements in the mode of operating the magnetic field detector generator, e.g. with respect to linearization, and the like.

SUMMARY OF THE INVENTION

I have found that considerable advantage over earlier temperature drift compensation can be gained by utilizing a portion of the drive current path of the Hall generator to compensate for the temperature drift described previously.

More specifically, according to the invention, an adjustable, practically temperature-independent input resistor can be provided for the drive current path of the Hall generator while an operational amplifier is included in the circuit, this operational amplifier having an inverting input connected to one of the signal voltage contacts of the Hall generator, a noninverting contact to which is applied a nondissipative direct or alternating current of constant amplitude against ground, the latter being the supply or input voltage.

In this circuit, therefore, with the output side of the operational amplifier connected to the terminal of the drive current path opposite that at which the input resistor is applied, a drive current is generated through the Hall field detector whose magnitude in the absence of induction is determined by the input voltage, the input resistance and the partial resistance at the input side of the drive current path determined by the position of the signal voltage contact connected to the operational amplifier. Consequently, a temperature change in the magnetic field detector of a Hall generator results in change in the drive current which, with proper setting of the input resistor, will exactly compensate for the temperature drift of the Hall voltage.

With this circuit, as in the prior art circuit previously described, with increasing temperature the drive current in the Hall generator increases, although with the system of the invention this is achieved by a nondissipative application of the input voltage to the drive current so that variation in the drive current is effected substantially exclusively by the temperature variations in a partial resistance of the magnetic field sensor or Hall generator. The change in the drive current is effective opposite the reduction in the Hall voltage with increasing temperature and with a corresponding dimensioning or setting of the input resistor so that this change in the Hall voltages takes place in a temperature range in which the Hall voltage is proportional to the resistance of the drive current path. The temperature effect on the Hall voltage can be fully compensated.

One of the advantages of the circuit of the invention is that it is consistent with other circuitry. For example, in the measurement of extremely small alternating magnetic fields with precision, it is desirable to use an alternating input voltage but preferably of higher frequency than that of the frequency of the alternating magnetic field so that the Hall voltage may be frequency-selective. This eliminates the need for compensaition of the zero residual voltage.

It has been found to be advantageous, moreover, in ensuring that the temperature drift is completely compensated by the circuit arrangement utilizing the operational amplifier, to supply the drive current path of the sensor with a conductor or wire having a practically temperature-independent resistance. Appropriate materials for this include manganin and constantan.

It has also been found to be advantageous, in accordance with the invention, to reduce the influence of the input voltage on the output voltage of the circuit which is required and, to this end, I may provide a differential amplifier, one input of which is connected to the second signal voltage terminal of the Hall generator while another input of the differential amplifier can be connected to a source of a voltage equal to or proportional to the input voltage. For example, the second input may be connected to the operational amplifier output to receive a voltage proportional to the input voltage. It may also be connected to the input voltage source directly, e.g. at the noninverting input of the operational amplifier. The output of the differential amplifier is the temperature compensated Hall voltage and, since the input voltage contribution can be subtracted entirely from this output, the system is particularly effective in the measurement of the small magnetic fields.

The so-called zero residual potential can, in a practical sense, generally not be avoided and thus such voltages can be superimposed upon the Hall voltage at the output of the differential amplifier. Such zero residual voltage are a characteristic of the fabrication of circuits of the type described.

Consequently, I have found it to be advantageous to provide means for compensating for such zero residual voltages. For example, between the output side drive current terminal of the Hall generator or field sensor and the output of the operational amplifier, I may provide a practically temperature-independent, preferably adjustable resistor which thus is provided at the second input of the differential amplifier at which the operational amplifier is connected to the latter.

This additional resistor does not alter the magnitude of the drive current but is utilized to set the magnitude of the temperature-dependent voltage which is applied by the operational amplifier to the second input of the differential amplifier and thus which can be used to cancel or reduce the contribution of the ohmic zero residual voltage.

The component of the zero residual voltage with the temperature dependency is compensated by setting of the differential amplifier.

A trimmer resistor can be provided between the output and second input of a second operational amplifier forming the differential amplifier. The second input is the inverting input of the second operational amplifier and the noninverting input can be connected to the first mentioned signal voltage terminal of the Hall generator.

Between the input side drive current terminal of the Hall generator and the signal voltage contact connected to the inverting input of the first operational amplifier, a portion of the Hall voltage generated by a magnetic field is applied. In a symmetrically constructed Hall generator this voltage is half the Hall voltage. This portion of the Hall voltage generates a contribution to the drive current which is affected not only by the temperature in the Hall generator but also by the magnetic field to be measured. This may result in an increase in the curvature of the characteristic of the Hall generator. To eliminate this inverse effect, I may provide a linearizing circuit which can include a third operational amplifier forming a summer or after receiving inputs from the supply voltage source and through a linearizing variable resistor from the Hall voltage output in a feed-back path so that the summer functions in a counterphase compensating mode.

The system of the invention has been found to be effective not only for the detection of induction limits but also for the detection of induction magnitudes over a wide range with high accuracy. It allows the use of extremely sensitive Hall generators which have not been found to be practical heretofore because of their large negative temperature coefficients.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
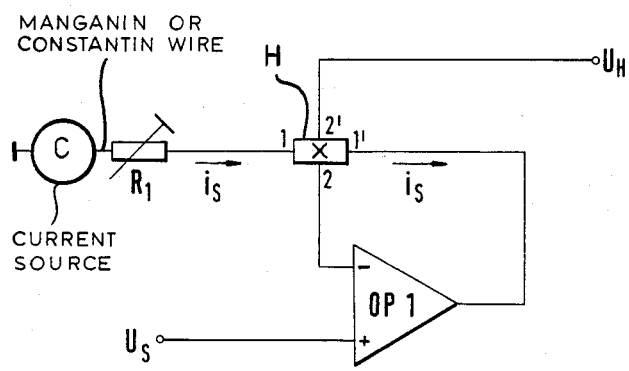
FIG. 1 is a circuit diagram of a simplified version of the temperature compensation circuit of the present invention in which the inverting input of the operational amplifier and the output thereof are connected to two terminals of the Hall generator and another terminal receives the signal input through a compensating input resistor and the fourth terminal taps the output voltage signal from the Hall sensor directly.

As can be seen from FIG. 1, a variable input resistor $R_1$ is provided in series with and ahead of the drive current path 1—1' of the Hall effect field sensor H while an operational amplifier OP 1 has its inverting input connected with the signal voltage contact 2 of the sensor H. The drive current source C is connected to this path by a wire composed of a material having a resistance which is substantially independent of temperature and selected from the group which consists of manganin and constantin.

An alternating current voltage $U_S$ is applied against ground to the noninverting input of the operational amplifier OP 1 and the output of the latter is connected to the terminal 1' of the control current path 1—1'.

The signal output measured against ground is shown at $U_H$ (Hall voltage).

This arrangement of the operational amplifier ensures that a control current $i_S$ is generated with a magnitude in the absence of induction or a magnetic field which is determined by the input direct or alternating current $u_s$ or $U_s$, the magnitude of the series resistor $R_1$ and the position of the signal voltage contents 2—2' which determine the input side partial resistance of the current flow path of the sensor.

In the embodiment illustrated, this location of the signal voltage contacts 2—2' is such that they are mirrorsymmetrical with respect to the central axis or median plane of the Hall generator. In practice, this location can be varied to select a partial resistance of the input side of the current flow path of the sensor as required. The fluctuations in the control current resulting from temperatures changes in the sensor are thus opposite and counteracted by the effect of the temperature changes of the Hall voltage so that the temperature dependency of the Hall voltage can be completely compensated by a corresponding adjustment or selection of the resistance value of the resistor $R_1$.

Figure 2:
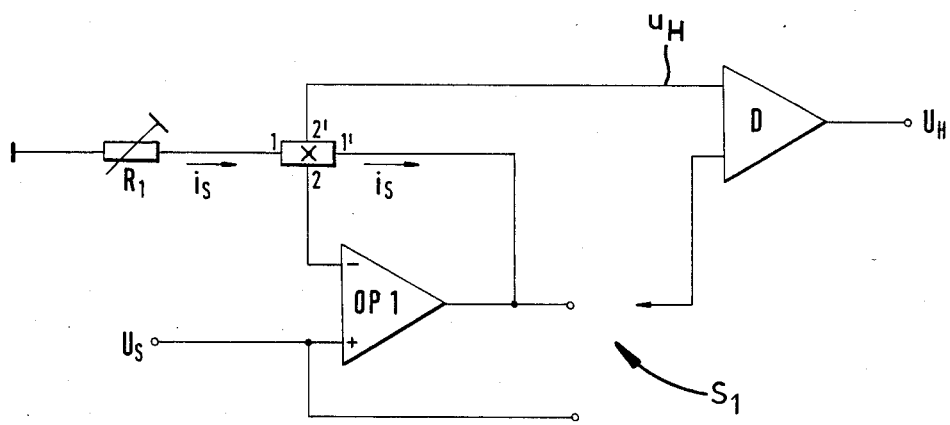
FIG. 2 is a circuit diagram of a Hall effect magnet field sensor generally operating on the principles of FIG. 1 but including circuit elements which can allow reduction of the exiting volume $u_s$ and $U_S$.

In FIG. 2 I have shown an embodiment of the circuit in which a differential amplifier D is provided to form a difference signal. This differential amplifier permits reduction of the input voltage $U_S$ or, put otherwise, reduces the contribution of the input voltage $U_S$ to the output voltage $U_H$. In this case, via a switch represented generally at $S_1$, one of the inputs of the differential amplifier D can be connected either to a terminal having the supply voltage $U_S$ or to the output of the operational amplifier OP 1 selectively.

In the mode in which the differential amplifier D is connected to the input voltage $U_S$ the magnitude of the latter is subjected directly from the value $U_H$ applied to the other terminal of the differential amplifier in connection with FIG. 1 to arrive at the output signal $u_H$. When the differential amplifier is connected by the switch $S_1$ to the output of the operational amplifier OP 1, the output of the differential amplifier represents a signal in which a voltage proportional to the input voltage $U_S$ has been subjected from the signal $u_H$ in providing the output $U_H$.

Figure 3:
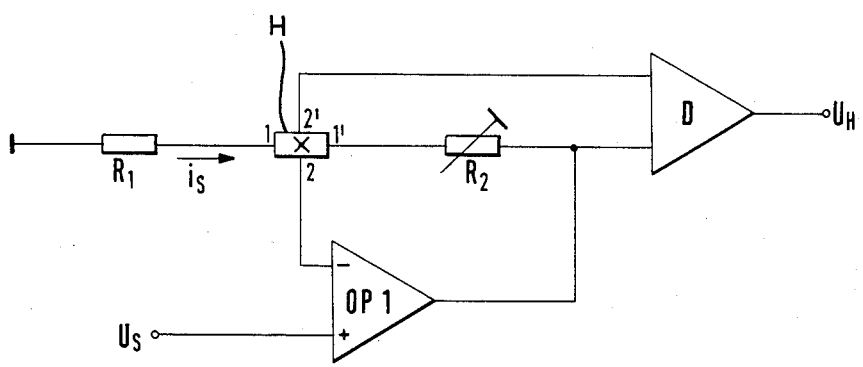
FIG. 3 is a circuit diagram of another system similar to that of FIG. 2 but additionally provided with means for compensating for the temperature dependent part of the zero-voltage.

FIG. 3 shows another embodiment of the invention which represents a modification of the embodiment of FIG. 2 in which two inputs of the differential amplifier D are connected respectively to the terminal 2' of the Hall sensor H and to the output of the operational amplifier OP 1. With an appropriate setting of the ohmic value of the resistor $R_2$, a desired zero setting voltage can be applied to the differential amplifier D so that the output $U_H$ will have no component which can be considered a zero magnetic field level. The calibration of the circuit is thereby simplified since the circuit can have a zero-voltage output in the absence of a magnetic field. In this system the temperature dependency of the zero residual voltage component can be compensated by the setting of the differential amplifier.

Figure 4:
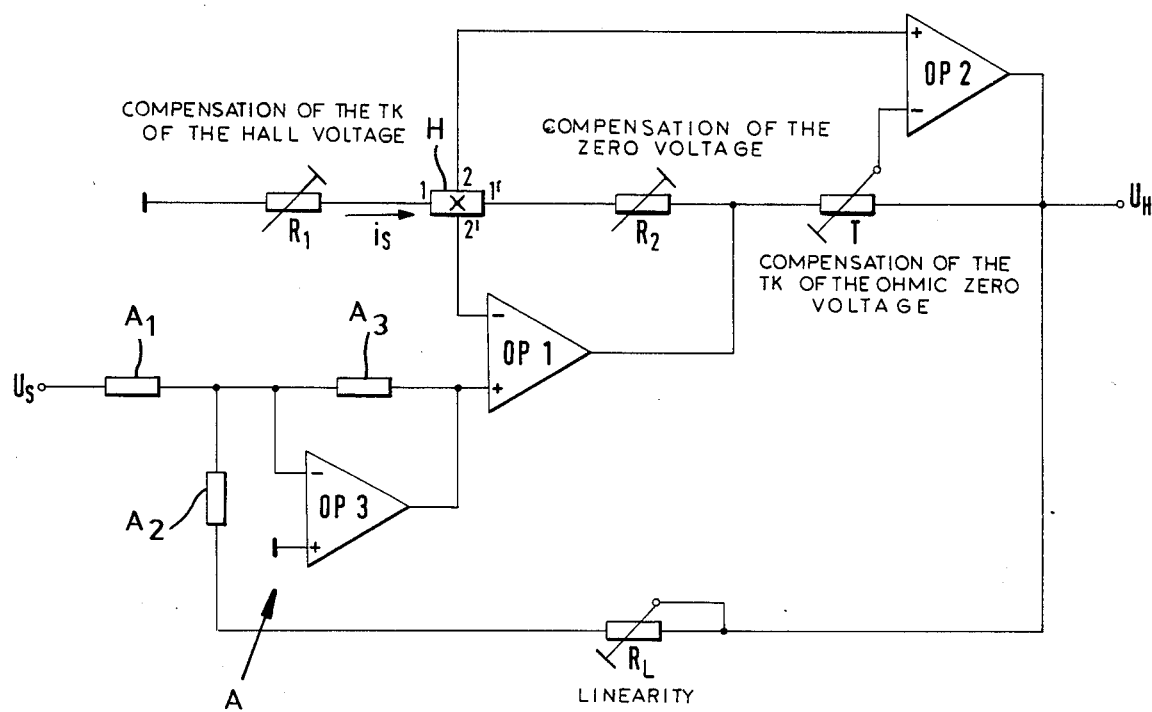
FIG. 4 is a circuit diagram according to the invention of a system utilizing a differential amplifier and means for linearizing the characteristic of the field sensor.

In the embodiment of FIG. 4, the role of the differential amplifier D of FIG. 3 is played by an operational amplifier OP 2 and a trimmer resistor connected in a feedback relationship to the operational amplifier as shown at T. This resistor permits, with corresponding adjustment of the resistor $R_2$, compensation of the temperature dependent portion of the zero residual voltage.

In FIG. 4, moreover, I have shown a circuit which can correct the nonlinearity of the characteristic of the Hall sensor H. This circuit comprises a summing circuit or adder A which can include an operational amplifier OP 3. The inputs to the adder, via appropriate resistors $A_1$ and $A_2$ are the input voltage $U_S$ and a feedback voltage from the output $U_H$. The latter is applied through a linearity adjusting variable resistor $R_L$. The feedback resistor $A_3$ of the operational amplifier $OP_3$ serving as the adder has also been shown. The noninverting input of $OP_3$ is connected to ground. In this case, a portion of the output voltage is countercoupled in opposite phase to the Hall voltage.

Figure 5:
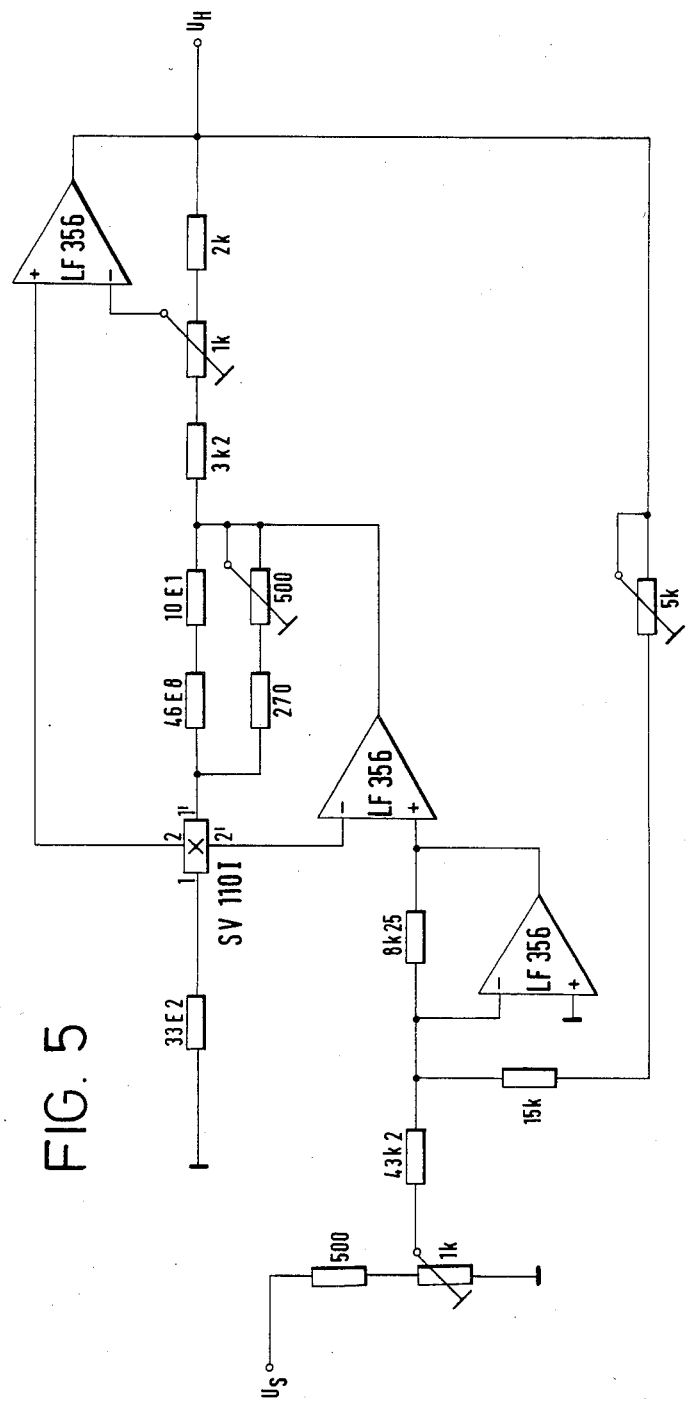
FIG. 5 is a circuit diagram identifying specific circuit elements for the circuit of FIG. 4.

In FIG. 5 I have shown a similar circuit including resistance values for all resistors and type designations for potentiometric operational amplifiers and the Hall effect generator which can be utilized in the circuit of FIG. 4.

I claim:

1. A magnetic field sensing circuit comprising:
   a Hall effect magnetic field sensor having a drive current path with respective input and output drive-current-path terminals, the input path terminal being connected to a drive current source, said drive-current-path extending between said input path terminal and said output path terminal on opposite sides of said path, and a first signal voltage terminal and a second signal voltage terminal at opposite sides thereof across said path and connected to said sensor, said first signal voltage terminal being physically on the Hall effect sensor between the input and output path terminals of said path;
   a substantially temperature-independent input resistor connected to the input terminal of said path in series with said drive current source;
   an operational amplifier having an inverting input connected to said first signal voltage terminal, a noninverting input connected to a source of a constant input voltage source, and an output connected to the output terminal of said path, whereby a drive current is generated in said path of a magnitude determined by the input voltage of said input voltage source, the input resistance and the partial resistance of said path depending upon the location of said first signal voltage terminals between the input and output terminals of said path so that a temperature change in the sensor changes the drive current and compensates for the temperature dependency of a Hall voltage tapped at said second signal voltage terminal;
   a differential amplifier having one input connected to said second voltage terminal and a second input connected to the output of said operational amplifier for providing at its output a temperature-compensated Hall voltage.

2. The circuit defined in claim 1 wherein said path at said input terminal is connected to a current source by a wire composed of a material having a resistance which is substantially independent of temperature and selected from the group which consists of manganin and constantan.

3. The circuit defined in claim 1, further comprising a compensating resistor for zeroing said temperature-compensated Hall voltage at the output of the differential amplifier connected between the output terminal of said path and the output of said operational amplifier, the last mentioned resistor being substantially of a temperature independent resistance.

4. The circuit defined in claim 3, further comprising a trimmer resistor between the output of said differential amplifier and the output of said operational amplifier and having a tap connected to the inverting input of said differential amplifier, said differential amplifier being formed as a second operational amplifier.

5. The circuit defined in claim 1, further comprising a trimmer resistor between the output of said differential amplifier and the output of said operational amplifier and having a tap connected to the inverting input of said differential amplifier, said differential amplifier being formed as a second operational amplifier.

6. The circuit defined in claim 4, further comprising an adder between said source and the noninverting input of the first operational amplifier.

7. The circuit defined in claim 6 wherein said adder includes a third operational amplifier having its output connected to said noninverting input of said first-mentioned operational amplifier and receiving signals from said source and from the output of the differential amplifier for additively combining said signals.

8. The circuit defined in claim 7, further comprising a variable resistor connected between the output of said differential amplifier and said adder.

9. The circuit defined in claim 5, further comprising an adder between said source and the noninverting input of the first operational amplifier.

10. The circuit defined in claim 9 wherein said adder includes a third operational amplifier having its output connected to said noninverting input of said first-mentioned operational amplifier and receiving signals from said source and from the output of the differential amplifier for additively combining said signals.

11. The circuit defined in claim 10, further comprising a variable resistor connected between the output of said differential amplifier and said adder.

* * * * *